(12) United States Patent
Hsiao et al.

(10) Patent No.: US 6,238,988 B1
(45) Date of Patent: May 29, 2001

(54) METHOD OF FORMING A MOS TRANSISTOR

(75) Inventors: Chih-Yuan Hsiao, Feng-Shan; Hua-Chou Tseng, Hsin Chu, both of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/457,137

(22) Filed: Dec. 9, 1999

(51) Int. Cl.[7] .................................................. H01L 21/336
(52) U.S. Cl. ............................................ 438/305; 438/231
(58) Field of Search .................................... 438/202, 203, 438/230, 231, 301, 303, 304, 305, 595, 596, 197, 306

(56) References Cited

U.S. PATENT DOCUMENTS

| | | | |
|---|---|---|---|
| 5,091,763 | * | 2/1992 | Sanchez ............................ 357/23.9 |
| 5,766,969 | * | 6/1998 | Fulford, Jr. et al. ................. 438/305 |
| 5,847,428 | * | 12/1998 | Fulford, Jr. et al. ................. 257/344 |

* cited by examiner

Primary Examiner—David Nelms
Assistant Examiner—David Nhu
(74) Attorney, Agent, or Firm—Winston Hsu

(57) ABSTRACT

The present invention relates to a method of forming a MOS transistor on a semiconductor wafer. A gate is first formed on the silicon substrate of the semiconductor wafer, then a first spacer made of silicon nitride and the LDD are formed adjacent to the gate. A conductive layer is formed on the semiconductor wafer that forms a corner on the conjoining section of the spacer and the silicon substrate. A spacer made of silicon oxide is formed on the corner of the conductive layer 58, then an etching process is performed to remove the conductive layer above the gate and the silicon substrate. The conductive layer on the corner adjacent to the first spacer remains. Finally, the spacer made of silicon oxide is completely removed, and an ion implantation process is performed to form a source and drain on the silicon substrate adjacent to the conductive layer.

11 Claims, 6 Drawing Sheets

METHOD OF FORMING A MOS TRANSISTOR

BACKGROUND OF THE INVENTION

1. Field of the Invention

The present invention relates to a semiconductor process, and more particularly, to a method of forming a MOS transistor on a semiconductor wafer.

2. Description of the Prior Art

A metal-oxide semiconductor (MOS) is a very common electrical device in integrated circuits. A gate, a source, and a drain together comprise the MOS transistor to form a unit with four nodes. By utilizing channel effects generated by the gate of the MOS under different gate voltages, the MOS is often made to function as a digital solid switch. With the increasing sophistication of production technology, the size of these units has become smaller and smaller, and consequently so, too, has their channel length. However, when the channel length is too short, a short channel effect can occur that affects the switching function of the gate.

A lightly doped drain implantation process is currently employed to resolve the short channel effect. Please refer to FIG. 1 to FIG. 5. FIG. 1 to FIG. 5 are cross-sectional diagrams of the prior art method of forming a MOS transistor. As shown in FIG. 1, the MOS transistor is formed on a semiconductor wafer 10. The semiconductor wafer 10 comprises a silicon substrate 12, and a dielectric layer 14 installed on the silicon substrate 12.

As shown in FIG. 2, during the formation of the MOS transistor, a gate 16 is formed on a predetermined region of the dielectric layer 14. The dielectric layer 14 beyond the predetermined region is removed down to the silicon substrate 12. As shown in FIG. 3, a first ion implantation process 18 is performed to form two doped regions on the silicon substrate 12 adjacent to two opposite sides of the gate. Each doped region functions as a lightly doped drain (LDD) 22 of the MOS transistor.

As shown in FIG. 4, two spacers 24 made of insulating material are formed on opposite sides of the gate 16. As shown in FIG. 5, a second ion implantation process is performed to form two doped regions on the silicon substrate 12 adjacent to the spacers 24. The two doped regions function as a source 27 and a drain 28 of the MOS transistor.

Please refer to FIG. 6. FIG.6 is a cross-sectional diagram of the MOS transistor after a self-alignment silicide process has been performed. The self-alignment silicide (salicide) process is performed to reduce the contact resistance of each silicon surface. As shown in FIG. 6, after the self-alignment silicide process, a silicide layer 32 is formed on the surface of the gate 16, the source 27 and the drain 28 of the MOS transistor.

The length of the spacer 24 on two opposite sides of the gate 16 decides the final length of the LDD 22. In order to keep the junction deep between the source 27 and the drain 28, the width of the spacer 24 is always about 800~1500 Å. This prevents the device driving current of the unit from being affected by thermal treatment processes or the source and drain implantation process, and also avoids device shorting effects. However, with the reduction of the unit size, the LDD 22 also becomes smaller and thinner. This lower implantation energy of the LDD greatly increases the extension external resistance of the LDD 22, and decreases the extension coupling between the gate and the LDD 22.

SUMMARY OF THE INVENTION

It is therefore a primary objective to the present invention to provide a method of forming a MOS transistor on a semiconductor to solve the above mentioned problems.

In a preferred embodiment, the present invention relates to a method of forming a metal oxide semiconductor (MOS) transistor on a semiconductor wafer, the semiconductor wafer comprising a silicon substrate, the method comprising:

forming a gate having a rectangular-shaped cross-section on a predetermined region of the silicon substrate;

performing a first ion implantation to form two doped regions on the silicon substrate adjacent to two opposite sides of the gate, each doped region functioning as a lightly doped drain of the MOS transistor;

forming a first spacer with insulating material on each of the opposite sides of the gate;

forming a uniform conductive layer on the semiconductor wafer, the conductive layer covering the silicon substrate, the gate and the two first spacers;

forming a uniform sacrificial layer on the conductive layer;

performing a first etching process to remove a portion of the sacrificial layer, the remaining sacrificial layer on the conductive layer forming two second spacers outside of the first two spacers;

performing a second etching process to remove the conductive layer on the silicon substrate and on the top of the gate, the second spacers being used as a mask so that the conductive layer covered by the second spacers will not be removed thereby forming two remaining conductive layers, the first spacers isolating the two remaining conductive layers from the gate;

removing the second spacer completely;

performing a second ion implantation to form two doped regions just under the silicon substrate adjacent to each of the two remaining conductive layers, the two doped regions functioning as a source and a drain of the MOS transistor.

It is an advantage of the present invention that the resistance of the LDD will be reduced, increasing the device driving current of the MOS transistor and improving its electrical performance.

These and other objectives of the present invention will no doubt become obvious to those of ordinary skill in the art after reading the following detailed description of the preferred embodiment which is illustrated in the various figures and drawings.

DETAILED DESCRIPTION OF THE PREFERRED EMBODIMENT

Please refer to FIG. 7 to FIG. 16. FIG. 7 to FIG. 16 are cross-sectional diagrams of the present invention method of forming a MOS transistor. The present invention relates to forming a MOS transistor on a semiconductor wafer 40. The semiconductor wafer 40 comprises a silicon substrate 42, and a dielectric layer 44 made of silicon dioxide ($SiO_2$) on the silicon substrate 42 that functions as a gate oxide layer of the MOS transistor.

Figure 1:
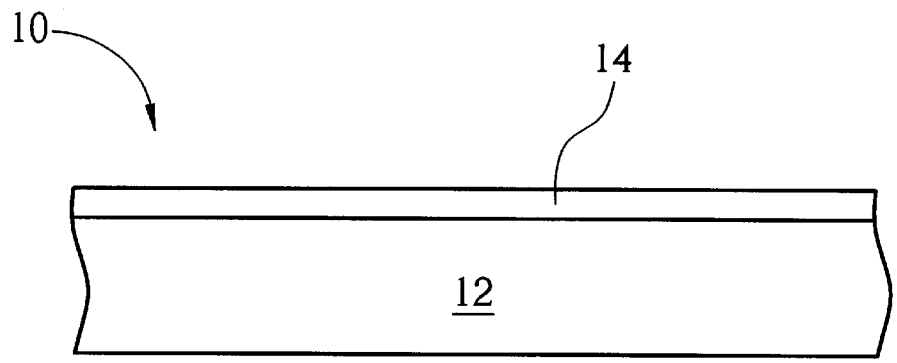
FIG. 1 to FIG. 5 are cross-sectional diagrams of the prior art method of forming a MOS transistor.
Figure 2:
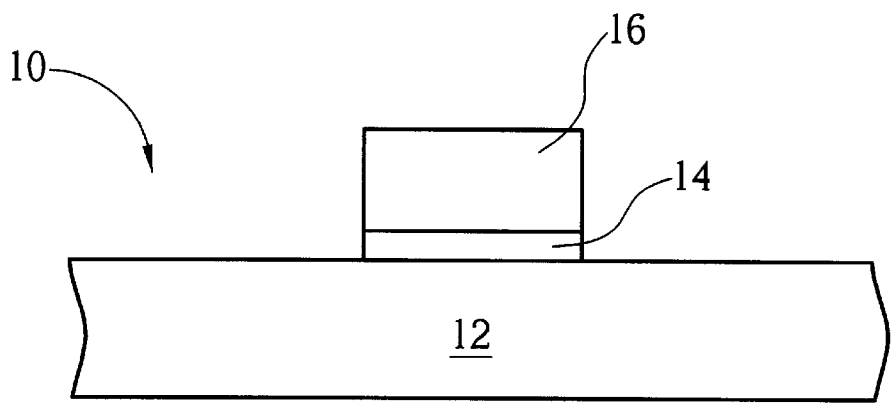
Figure 3:
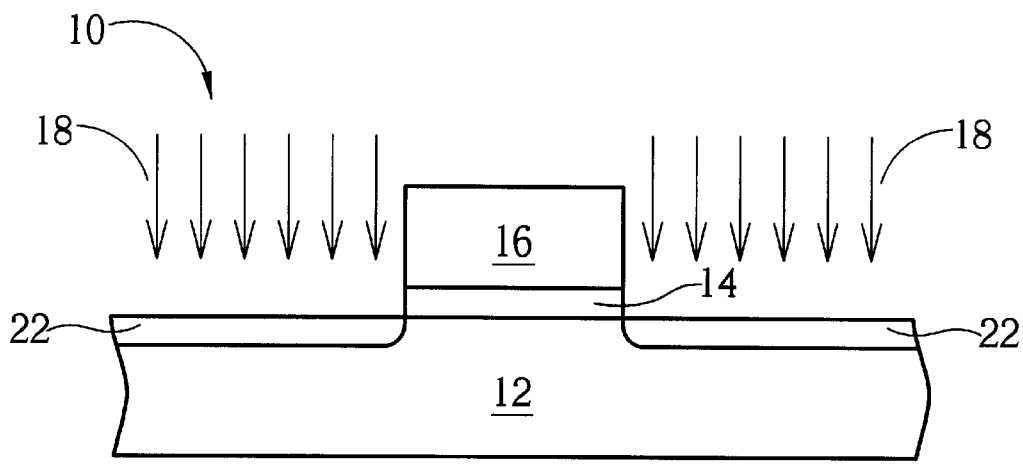
Figure 4:
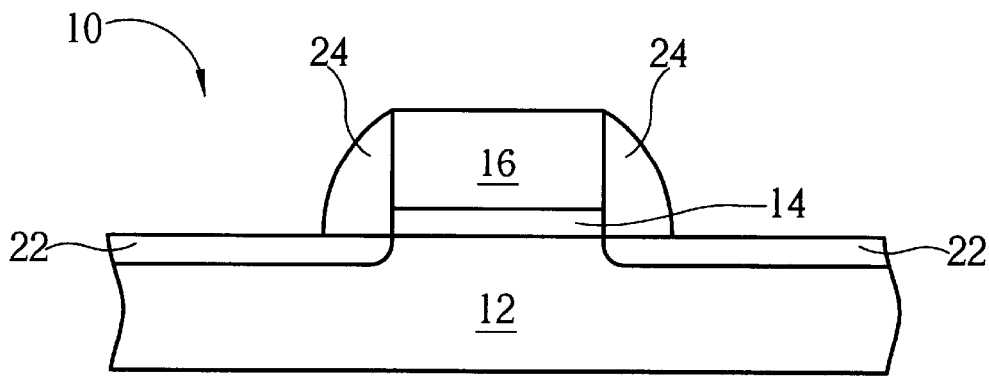
Figure 5:
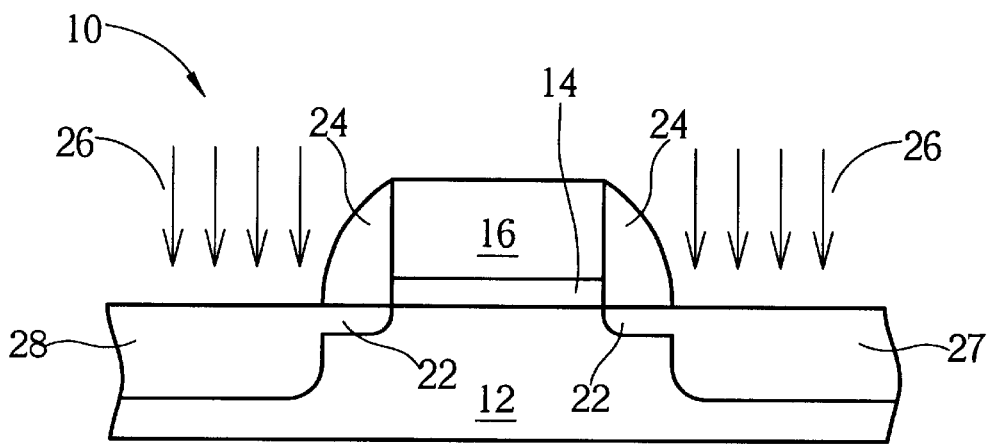
Figure 6:
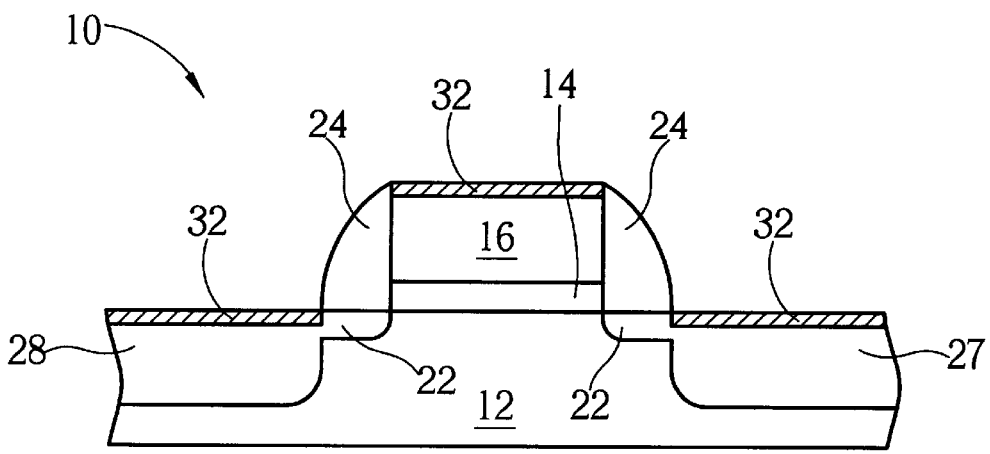
FIG. 6 is a cross-sectional diagram of performing a self-alignment silicide process on the prior art MOS transistor.
Figure 7:
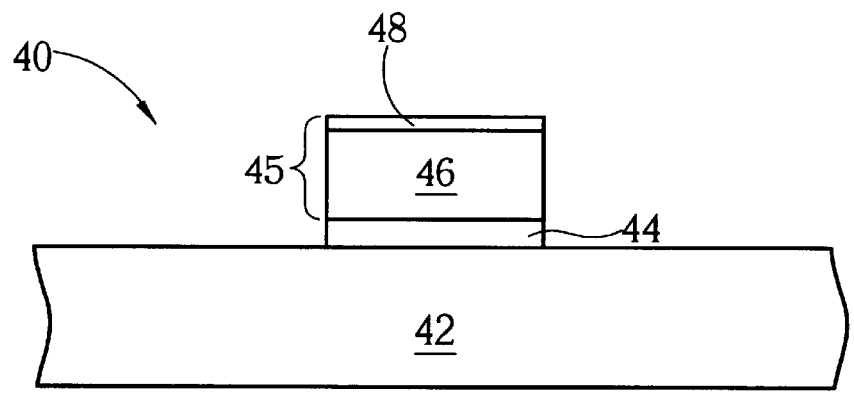
FIG. 7 to FIG. 16 are cross-sectional diagrams of the present invention method of forming a MOS transistor.

As shown in FIG. 7, a gate 45 having a rectangular-shaped cross-section is formed on a predetermined region of the dielectric layer 44. The dielectric layer beyond the predetermined region is removed down to the silicon substrate 42. The gate 45 comprises a doped polysilicon layer 46 and a silicon-oxy-nitride ($SiO_xN_y$) layer. The silicon-oxynitride ($SiO_xN_y$) layer is positioned on the doped polysilicon layer 46 and is used as an anti-reflection coating layer (ARC) layer 48.

Figure 8:
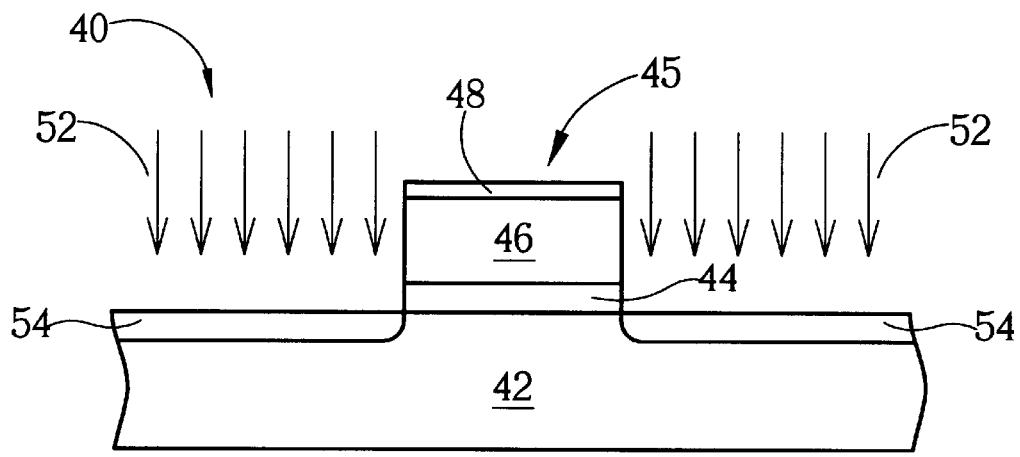
Figure 9:
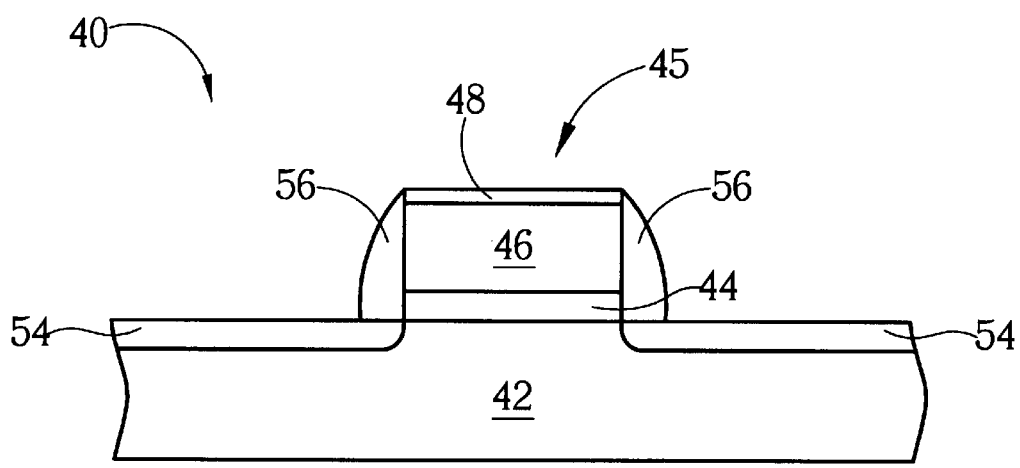

As shown in FIG. 8, a first ion implantation process 52 is performed on the silicon substrate 42 adjacent to the gate 45 to form two doped regions that serve as lightly doped drains (LDD) 54. As shown in FIG. 9, a silicon nitride layer (not shown) is formed on the gate 45 and the silicon substrate 42, and an anisotropic dry etching process is performed to downwardly remove the silicon nitride layer. The remaining silicon nitride layer on opposite sides of the gate forms the first spacers 56 with a width of 300~400 Å.

Figure 10:
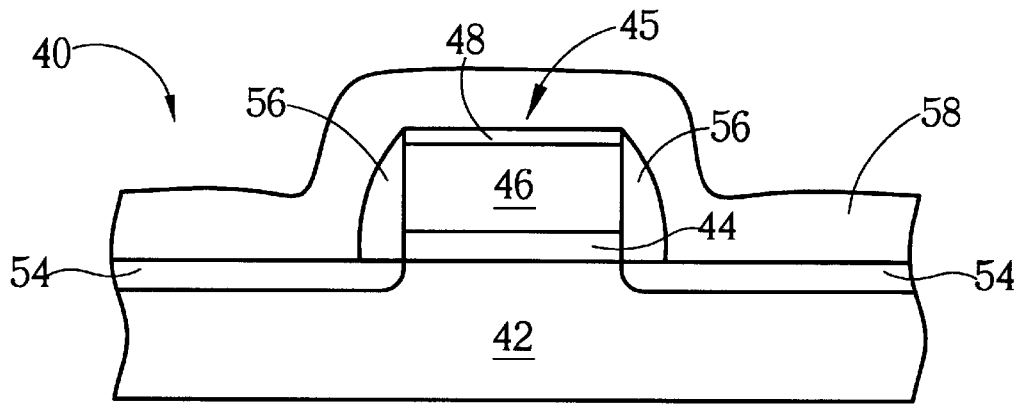

As shown in FIG. 10, a conductive layer 58 is uniformly formed on the semiconductor wafer 40. The conductive layer 58 covers the silicon substrate 42, the gate 45, and the first spacers 56. The conductive layer 58 is made of polysilicon, amorphous silicon or epitaxy. The conductive layer 58 along the profile of the semiconductor wafer 40 forms a corner on the conjoining section of the first spacer 56 and the silicon substrate 42.

Figure 11:
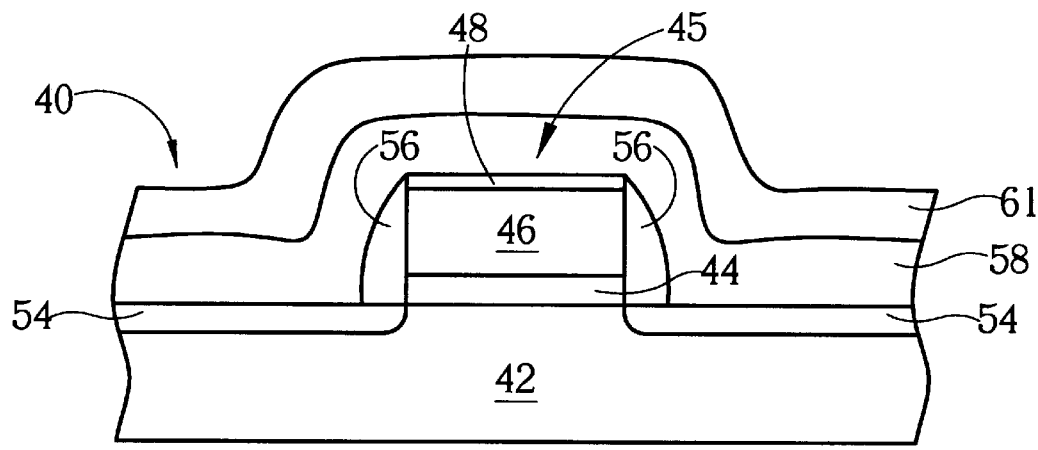
Figure 12:
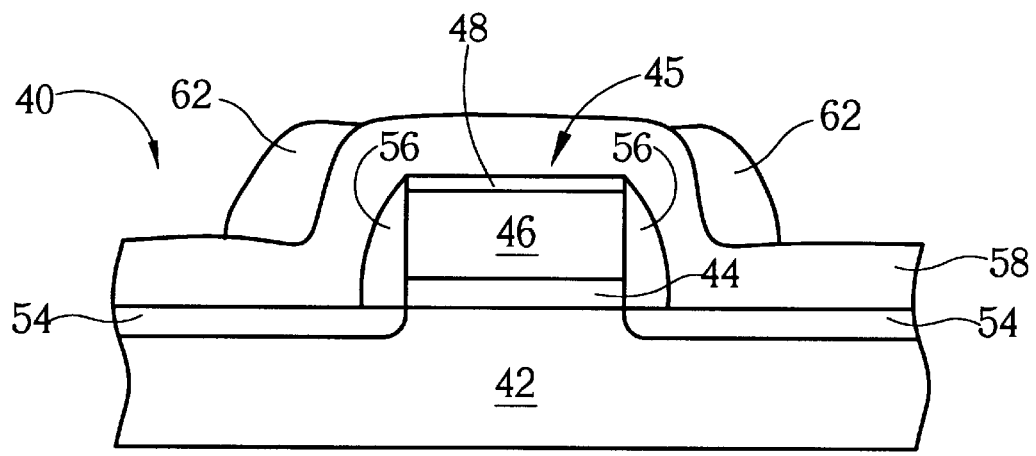

As shown in FIG. 11, a silicon dioxide layer is uniformly formed on the conductive layer 58 to be used as a sacrificial layer 61. As shown in FIG. 12, a first etching process is performed to remove a portion of the sacrificial layer 61. The remaining sacrificial layer 61 on the conductive layer 58 forms two second spacers 62 outside of the first spacers 56.

Figure 13:
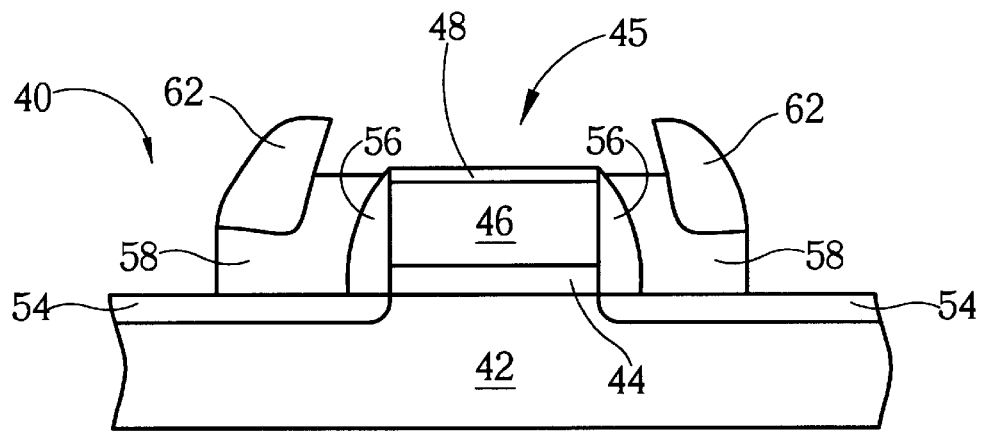
Figure 14:
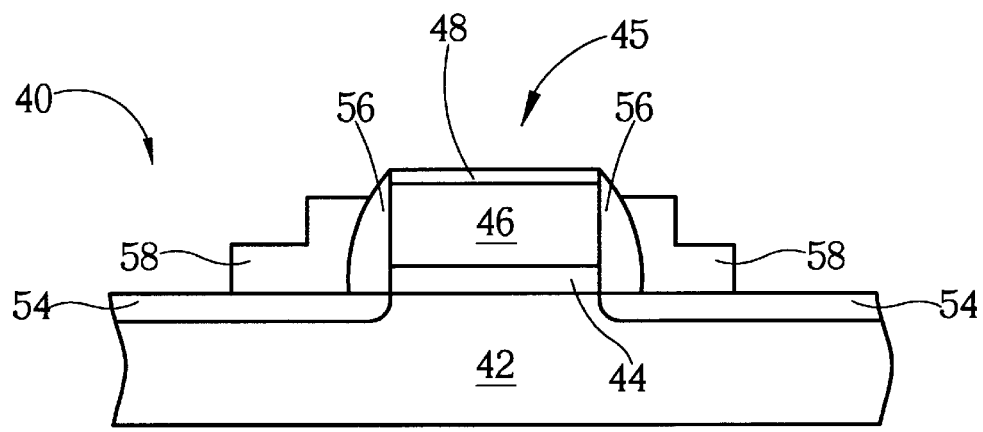

As shown in FIG. 13, a second etching process is performed to remove the conductive layer 58 from both the silicon substrate 42 and the top of the gate 45. The second spacer 62 is used as a mask so that the conductive layer 58 covered by the second spacers will not be removed. This results in two remaining conductive layers 58. The first spacers 56 isolate the two remaining conductive layers 58 from the gate 45. As shown in FIG. 14, a wet etching process is performed to completely remove the second spacers 62 on the conductive layers 58.

Figure 15:
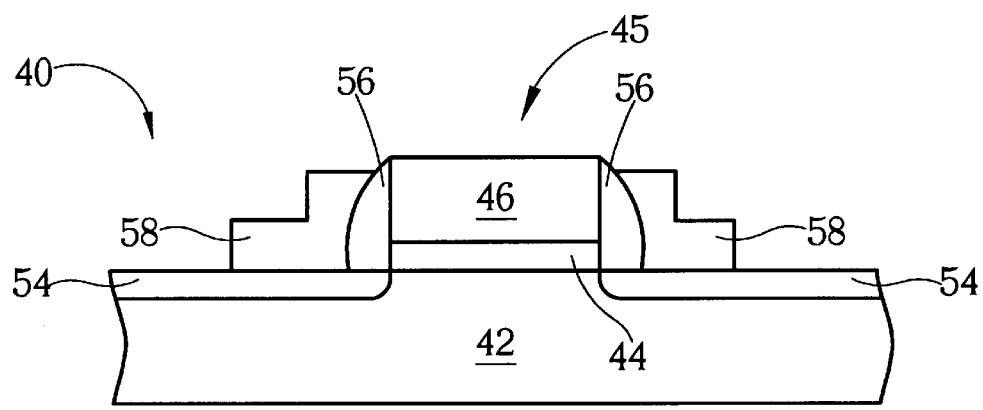
Figure 16:
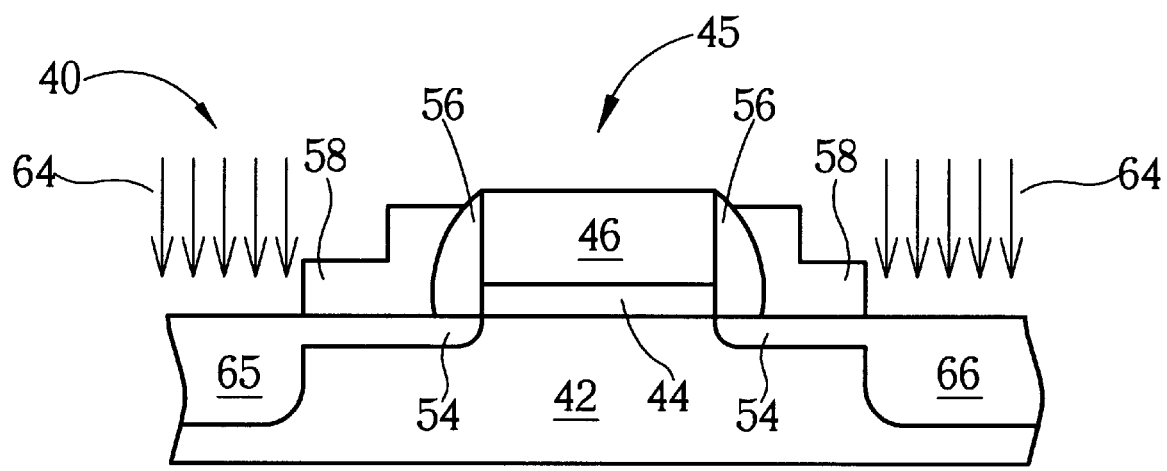

As shown in FIG. 15, a stripping process is performed to completely remove the ARC layer 48 on the gate 45. As shown in FIG. 16, a second ion implantation process 64 is performed to form two doped regions on the silicon substrate 42 adjacent to the remaining conductive layers 58. These doped regions serve as a source 65 and a drain 66 of the MOS transistor. During the second ion implantation process 64, the gate 45, the conductive layers 58 and the uncovered silicon substrate 42 are all transformed into doped polysilicon to become a conductive material with a low resistance.

Figure 17:
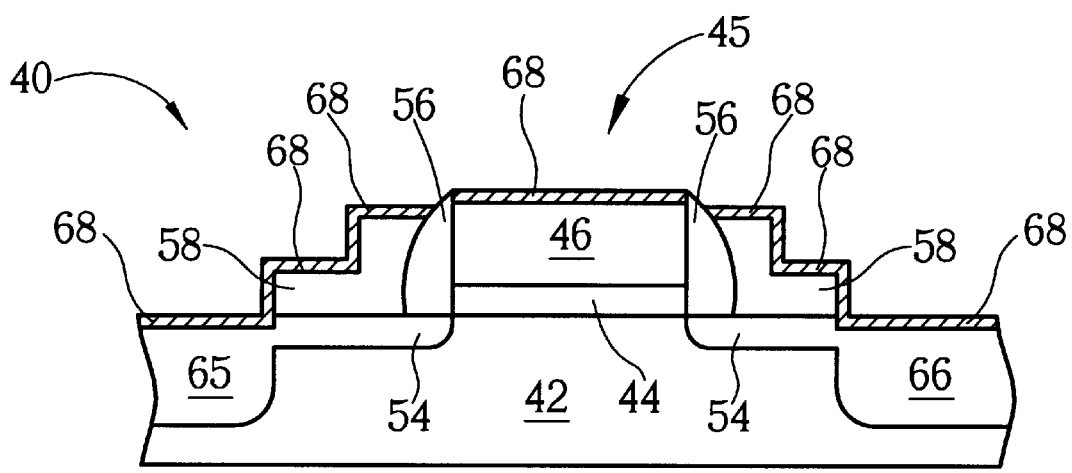
FIG. 17 is a cross-sectional diagram of performing a self-alignment silicide process on the MOS transistor.

After the MOS transistor is completed, a self-alignment silicide (salicide) process is performed to reduce the contact resistance of each surface. Please refer to FIG. 17. FIG. 17 is a cross-sectional diagram of performing a self-alignment silicide process on the MOS transistor. After the second ion implantation process 64 is performed, a tungsten layer (not shown) is sputtered onto the semiconductor wafer 40, and a thermal process is performed to form a silicide layer 68 made of tungsten silicide (WSi) on the conductive layer 58, the gate 45, the source 65 and the drain 66. This silicide layer reduces the contact resistance of each surface.

The first spacer 56 with a width of 300~400 Å is first formed. A conductive layer 58 is then formed on the silicon substrate 42 adjacent to the first spacer 56 by utilizing the sacrificial layer 61. Hence, the total width of the first spacer 56 and the conductive layer 58 (the total of which is also the width of the LDD 54) is about 800~1500 Å. This can prevent device shorting effects.

In contrast to the prior art method, the method of forming the MOS transistor forms the spacer 56 and the conductive layer 58 with a total width of 800~1500 Å on each of the opposite sides of the gate 45. Furthermore, the conductive layer 58 is used as a landing pad of the LDD 54 to increase the contact area between the source 65 and the drain 66, and can also be taken as a buffer layer for the LDD 54 in the salicide process to reduce the extension external resistance of the LDD 54 and increase the extension coupling between the gate 45 and the LDD 54, which improves the driving current of the MOS transistor. Thus, the lengths of the LDD of the MOS transistor are comparable with the standard lengths of the current production procedures, but with a marked improvement in the electrical performance of the MOS transistor.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming a metal oxide semiconductor (MOS) transistor on a semiconductor wafer, the semiconductor wafer comprising a silicon substrate, the method comprising:

forming a gate having a rectangular-shaped cross-section on a predetermined region of the silicon substrate;

performing a first ion implantation to form two doped regions on the silicon substrate adjacent to two opposite sides of the gate, each doped region functioning as a lightly doped drain of the MOS transistor;

forming a first spacer with insulating material on each of the opposite sides of the gate;

forming a uniform conductive layer on the semiconductor wafer, the conductive layer covering the silicon substrate, the gate and the two first spacers;

forming a uniform sacrificial layer on the conductive layer;

performing a first etching process to remove a portion of the sacrificial layer, the remaining sacrificial layer on the conductive layer forming two second spacers outside of the first two spacers;

performing a second etching process to remove the conductive layer on the silicon substrate and on the top of the gate, the second spacers being used as a mask so that the conductive layer covered by the second spacers will not be removed thereby forming two remaining conductive layers, the first spacers isolating the two remaining conductive layers from the gate;

removing the second spacer completely;

performing a second ion implantation to form two doped regions just under the silicon substrate adjacent to each of the two remaining conductive layers, the two doped regions functioning as a source and a drain of the MOS transistor.

2. The method of claim 1 wherein a dielectric layer of silicon dioxide ($SiO_2$) is installed between the silicon substrate and the gate and is used as a gate oxide layer.

3. The method of claim 1 wherein the first spacers are made of silicon nitride (SiN), the formation of the first spacers comprising:

forming a silicon nitride layer uniformly on the silicon substrate and the gate; and performing an anisotropic dry etching to downwardly remove the silicon nitride layer, the remaining silicon nitride layer on the opposite sides of the gate forming the first spacers.

4. The method of claim 1 wherein the width of the first spacers is about 300~400 Å.

5. The method of claim 1 wherein the gate is made of polysilicon, and the second ion implantation transforms the polysilicon layer into a doped polysilicon layer.

6. The method of claim 5 wherein the gate further comprises a silicon-oxy-nitride ($SiO_xN_y$) layer on the polysilicon to function as an anti-reflection coating (ARC) layer.

7. The method of claim 6 wherein, prior to the second ion implantation, the method further comprises a stripping process to completely remove the sili-conoxy-nitride layer from the gate.

8. The method of claim 1 wherein the conductive layer can be made of polysilicon, amorphous silicon or epitaxy.

9. The method of claim 1 further comprising a self-alignment silicide (salicide) process performed after the second ion implantation to form a silicide layer on the remaining conductive layers, the gate, the source, and the drain of the MOS transistor so as to reduce the electrical contact resistance of each surface.

10. The method of claim 9 wherein the silicide layer is made of tungsten silicide ($WSi_x$).

11. The method of claim 1 wherein the sacrificial layer is made of silicon dioxide ($SiO_2$).

\* \* \* \* \*